(12) United States Patent
Cheng et al.

(10) Patent No.: US 8,865,561 B2
(45) Date of Patent: Oct. 21, 2014

(54) BACK-GATED SUBSTRATE AND SEMICONDUCTOR DEVICE, AND RELATED METHOD OF FABRICATION

(71) Applicant: International Business Machines Corporation, Armonk, NY (US)

(72) Inventors: Kangguo Cheng, Schenectady, NY (US); Thomas N. Adam, Slingerlands, NY (US); Bruce B. Doris, Slingerlands, NY (US); Ali Khakifirooz, Mountain View, CA (US); Alexander Reznicek, Troy, NY (US); Raghavasimhan Sreenivasan, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/803,856

(22) Filed: Mar. 14, 2013

(65) Prior Publication Data
US 2014/0273418 A1    Sep. 18, 2014

(51) Int. Cl.
*H01L 21/76* (2006.01)
*H01L 21/02* (2006.01)

(52) U.S. Cl.
CPC ................ *H01L 21/02365* (2013.01)
USPC ......................... 438/413; 438/400

(58) Field of Classification Search
USPC ................................ 438/400, 413
See application file for complete search history.

(56) References Cited

U.S. PATENT DOCUMENTS

| | | | |
|---|---|---|---|
| 5,923,067 A | | 7/1999 | Voldman |
| 6,072,217 A | * | 6/2000 | Burr ............................ 257/351 |
| 6,140,205 A | | 10/2000 | Jennings |
| 7,129,138 B1 | * | 10/2006 | Furukawa et al. ............ 438/294 |
| 7,244,991 B2 | | 7/2007 | Ohsawa |
| 7,247,534 B2 | | 7/2007 | Chidambarrao et al. |
| 7,955,940 B2 | | 6/2011 | Dyer et al. |
| 8,084,309 B2 | | 12/2011 | Cheng et al. |
| 2009/0236595 A1 | * | 9/2009 | Atanackovic .................. 257/43 |

* cited by examiner

*Primary Examiner* — Bradley K Smith
(74) *Attorney, Agent, or Firm* — Joseph J. Petrokaitis; Hoffman Warnick LLC

(57) ABSTRACT

A method of forming a semiconductor device is disclosed. The method includes forming a set of doped regions in a substrate; forming a crystalline dielectric layer on the substrate, the crystalline dielectric layer including an epitaxial oxide; forming a semiconductor layer on the crystalline dielectric layer, the semiconductor layer and the crystalline dielectric layer forming an extremely thin semiconductor-on-insulator (ETSOI) structure; and forming a set of devices on the semiconductor layer, wherein at least one device in the set of devices is formed over a doped region.

17 Claims, 5 Drawing Sheets

BACK-GATED SUBSTRATE AND SEMICONDUCTOR DEVICE, AND RELATED METHOD OF FABRICATION

FIELD OF THE INVENTION

Embodiments of this disclosure relate generally to semiconductor devices and, more particularly, to back-gated semiconductor device design, layout, and related methods of fabrication.

BACKGROUND

In the fabrication of integrated circuit (IC) devices (also referred to as semiconductor devices), many processes, steps, and techniques may be applied to form components and materials into the desired products. For example, in the fabrication of high-performance extremely thin semiconductor-on-insulator (ETSOI) structures/devices (e.g., extremely thin silicon-on-insulator structures, planar depleted device architectures, etc.), back-gate biases (e.g., substrate bias, body effects to threshold voltages, etc.) may be desired to tune device characteristics, manage power consumption, etc. Fabrication of these devices typically includes implantation of the substrate through a top ETSOI structure and/or wafer bonding following substrate implantation. However, implantation through the ETSOI structure may create dopant contamination in the ETSOI structure and may damage the crystal structure of the ETSOI structure, resulting in poor device performance and reliability. Further, wafer bonding during the fabrication of these devices may produce dopant diffusion throughout the structure due to the thermal budget of the subsequent bonding steps.

BRIEF SUMMARY

A first aspect of the disclosure provides a method of forming a semiconductor device, the method including: forming a set of doped regions in a substrate; forming a crystalline dielectric layer on the substrate, the crystalline dielectric layer including an epitaxial oxide; forming a semiconductor layer on the crystalline dielectric layer, the semiconductor layer and the crystalline dielectric layer forming an extremely thin semiconductor-on-insulator (ETSOI) structure; and forming a set of devices on the semiconductor layer, wherein at least one device in the set of devices is formed over a doped region.

A second aspect of the disclosure provides a method of forming a back-gate substrate, the method including: forming a doped region in a substrate, the doped region configured to communicatively connect to a field effect transistor (FET); forming a crystalline dielectric layer on the substrate and the doped region, the crystalline dielectric layer including an epitaxial oxide; forming a crystalline semiconductor layer on the crystalline dielectric layer; and forming a set of devices on the crystalline semiconductor layer above the doped region.

A third aspect of the disclosure provides a method of forming a semiconductor device, the method including: forming a doped region in a substrate; forming a crystalline dielectric layer on the substrate and the doped region; forming a crystalline semiconductor layer on the crystalline dielectric layer; and forming a field effect transistor (FET) on the crystalline semiconductor layer above the doped region.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-7, like numbering may represent like elements. Redundant explanation of these elements has been omitted for clarity. Finally, it is understood that the components of FIGS. 1-7 and their accompanying descriptions may be applied to any embodiment described herein.

DETAILED DESCRIPTION

Figure 1:
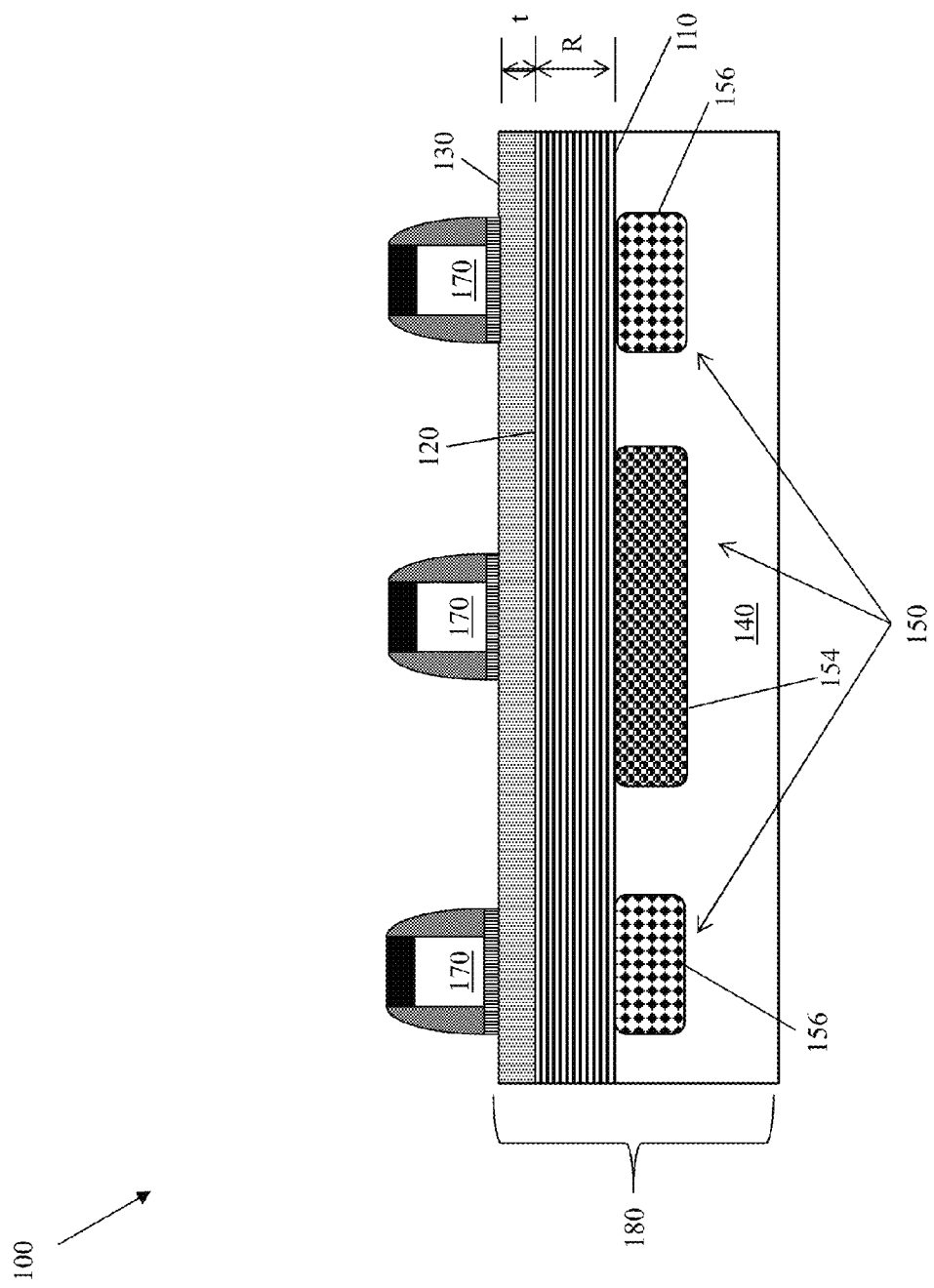
FIG. 1 is an illustration of a portion of a semiconductor device.

FIG. 1 is an illustration of a cross sectional view of a portion of a semiconductor device 100 including a structure 180 (e.g., a back-gate substrate structure) shown according to embodiments of the invention. In an embodiment, structure 180 may include a substrate 140 with a set of regions 150 formed therein. Set of regions 150 may include a P-well region 154 (e.g., a portion of the substrate doped with P-type dopants (e.g., boron, indium, etc.) which may impact mobility) and a set of N-well regions 156 (e.g., a portion of the substrate doped with N-type dopants (e.g., phosphorous, arsenic, etc.) which may provide/alter a charge in the region). A dielectric layer 120 (e.g., a crystalline dielectric layer, a crystalline oxide, back-gate dielectric layer, etc.) may be disposed on a substrate surface 110 of substrate 140. Crystalline dielectric layer 120 may be formed of an epitaxial oxide. In an embodiment, crystalline dielectric layer 120 includes a rare earth oxide (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$). In one embodiment, crystalline dielectric layer 120 includes combinations of rare earth oxides (e.g., a material such as $ABO_3$, where 'A' and 'B' may be any rare earth metal (e.g., lanthanum scandium oxide ($LaScO_3$)) and may be epitaxially grown on substrate 140. In one embodiment, crystalline dielectric layer 120 may include Perovskites (e.g. strontium titanate ($SrTiO_3$) or barium titanate ($BaTiO_3$)). In yet another embodiment crystalline dielectric layer 120 may include aluminum oxide $Al_2O_3$ or aluminum oxide compounds (e.g., lanthanum aluminum $LaAlO_3$) which may be deposited by pulsed laser deposition (PLD). In an embodiment, crystalline dielectric layer 120 may be deposited on substrate 140 and may have a thickness 'R' of about 2 nanometers to about 500 nanometers. In one embodiment, crystalline dielectric layer 120 may have a thickness of about 10 nanometers to about 150 nanometers. In another embodiment, crystalline dielectric layer 120 may have a thickness of about 20 nanometers to about 50 nanometers. Semiconductor device 100 may further include a crystalline semiconductor layer 130 (e.g., an extremely thin semiconductor-on-insulator (ETSOI) structure, a crystalline silicon layer, an extremely thin silicon-on-insulator layer, a top layer formed on the epitaxial oxide/crystalline dielectric layer 120, a planar depleted device architecture, etc.) disposed on crystalline dielectric layer 120. In an embodiment, the extremely thin semiconductor-on-insulator structure may have a thickness between about 2 nanometers and about 20 nanometers. In one embodiment, the extremely thin semiconductor-on-insulator structure may have a thickness of between about 4 nanometers and about 10 nanometers.

Substrate 140 may be made from any now known or later developed semiconductor materials including but not limited to, for example, silicon, germanium, silicon-germanium alloy, silicon carbide, and compound (e.g. III-V and II-VI) semiconductor materials. Non-limiting examples of compound semiconductor materials include gallium arsenide, indium arsenide, and indium phosphide. Typically substrate 140 may be about, but is not limited to, several hundred microns thickness. For example, substrate 140 may include a thickness ranging from about 0.5 millimeter (mm) to about 1.5 mm. In some embodiments, substrate 140 may consist essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary. It is understood that while examples described herein and in the figures are directed toward silicon semiconductor devices, these structures and/or material compositions are merely exemplary, and that the structures and processes described herein may be applied to any semiconductor device or material composition now known or later developed.

In an embodiment, crystalline semiconductor layer 130 may have a thickness 't' of between about 1 nanometer and about 20 nanometers. In one embodiment, crystalline semiconductor layer 130 may have a thickness 't' of between about 3 nanometers and about 8 nanometers. In another embodiment, crystalline semiconductor layer 130 may be strained. A set of devices (e.g., transistors, gates, etc.) 170 may be disposed on crystalline semiconductor layer 130. In an embodiment, set of devices 170 may be formed above set of regions 150. In one embodiment, set of devices 170 may include field effect transistors (FET) formed directly above and/or communicatively connected to P-well region 154 and N-well regions 156 (e.g., a device characteristic (e.g., a threshold voltage) of the FETs is a function of the well doping and/or the voltage applied to the well beneath each FET).

In an embodiment, crystalline semiconductor layer 130 may be undoped and regions/portions of substrate 140 may be substantially defined and/or segregated (e.g., substrate 140 may remain substantially pure silicon except for in well regions 150, no well dopant diffusion, etc.). In one embodiment, crystalline semiconductor layer 130 may be formed by epitaxial growth on top of crystalline dielectric layer 120 (e.g., an epitaxial oxide layer, a rare earth oxide (REO) layer, etc.). Besides silicon, other semiconductor materials such as germanium, silicon germanium, GeSn, III-V compound semiconductor, II-VI compound semiconductor materials may also be included in crystalline semiconductor layer 130. In an embodiment, crystalline semiconductor layer 130 may be doped or un-doped and may include: silicon, germanium, silicon-germanium alloy, and/or carbon doped silicon (Si:C). In one embodiment, crystalline semiconductor layer 130 may include carbon doped silicon with an atomic carbon concentration of between about 0.2% to about 4.0% substitutional carbon. In one embodiment, crystalline semiconductor layer 130 may include a carbon doped silicon type material having a concentration of about 0.3% to about 2.5% substitutional Carbon. It is understood that the total amount of carbon in crystalline semiconductor layer 130 may be higher than the substitutional amount. In a preferred exemplary embodiment, crystalline semiconductor layer 130 may include silicon, germanium, silicon germanium, carbon doped silicon, a silicon-germanium alloy, and compound (e.g. III-V and II-VI) semiconductor materials etc. In an embodiment, carbon doped silicon may include a concentration of substitutional Carbon (C) of about 0.4 to about 2.5% Si:C.

FIGS. 2-6 are illustrations of a device undergoing a method according to embodiments of the invention. Although FIGS. 2-6 show the method of forming a portion of a semiconductor device 100 shown in FIGS. 1 and 6, it is understood that a similar method may be employed to form any other like semiconductor device.

Figure 2:
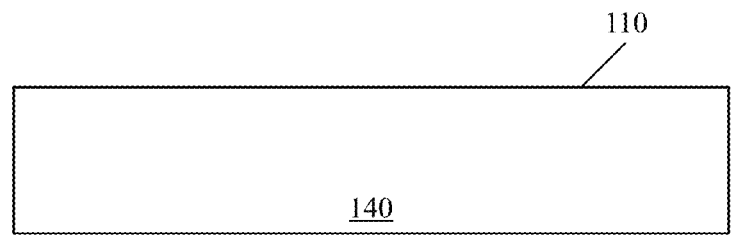
FIGS. 2-6 are illustrations of a method of forming a semiconductor device according to embodiments of the invention.

FIG. 2 is an illustration of a cross sectional view of a portion of a substrate 140 according to embodiments. In an embodiment, substrate 140 includes a substrate surface 110 for deposition and/or formation of regions, devices, and/or layers as described herein. Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary.

Figure 3:
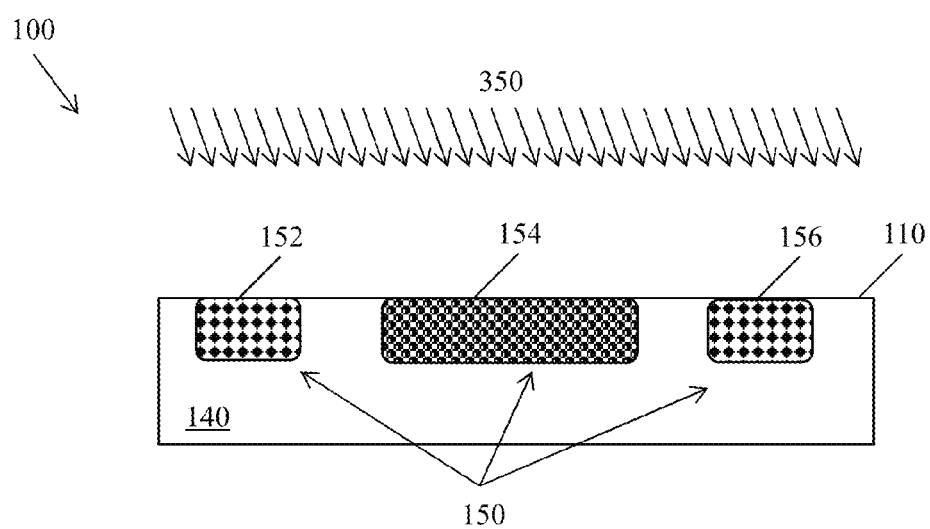

Turning to FIG. 3, an illustration of a cross sectional view of a portion of semiconductor device 100 is shown undergoing an implantation 350 to form a set of regions 150 according to embodiments. Set of regions 150 may include a P-well 154 and a set of N-wells 156. In an embodiment, N-well 156 may include a semiconductor region doped with n-type dopants (e.g., arsenic, phosphorus, antimony, etc.). P-well 154 may include a semiconductor region doped with p-type dopants (e.g., boron, indium, etc.). In one embodiment, P-well 154 and/or N-well 156 may be formed by ion implantation of substrate 140 followed by a thermal anneal (e.g., furnace anneal, rapid thermal anneal, laser anneal, flash anneal, etc.). In an embodiment, P-well 154 and/or set of N-wells 156 may be implanted and/or doped in accordance with known methods. It is understood that embodiments that are described herein with reference to specific substrates, regions, and layer orientations/compositions are for exemplary purposes, and that any combination of layers (e.g., oxide and nitride layers and configurations), implants, substrate modifications and/or trench placements may be included as an embodiment of the invention. The implants, regions, trenches, and/or layers described herein may be formed in substrates and/or layers which are substantially similar and/or different to those described and shown in FIGS. 1-7.

Figure 4:
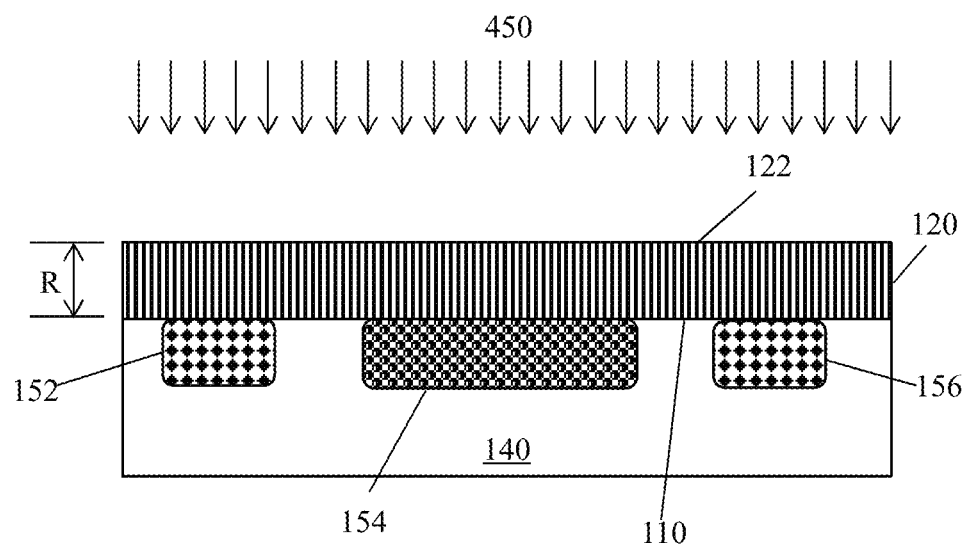

Turning to FIG. 4, an illustration of a crystalline dielectric layer 120 (e.g., an epitaxial oxide) being disposed on a substrate 140 is shown according to embodiments. In an embodiment, crystalline dielectric layer 120 may be epitaxially grown 450 on substrate 140 and may include a rare earth oxide (e.g., cerium oxide ($CeO_2$), lanthanum oxide ($La_2O_3$), yttrium oxide (Y2O3), gadolinium oxide ($Gd_2O_3$), europium oxide ($Eu_2O_3$), terbium oxide ($Tb_2O_3$), or combinations thereof (e.g., a material such as $ABO_3$, where 'A' and 'B' may be any rare earth metal (e.g., lanthanum scandium oxide ($LaScO_3$)). In one embodiment, crystalline dielectric layer 120 may include Perovskites (e.g. strontium titanate ($SrTiO_3$) or barium titanate ($BaTiO_3$)). In yet another embodiment crystalline dielectric layer 120 may include aluminum oxide $Al_2O_3$ or aluminum oxide compounds (e.g., lanthanum aluminum $LaAlO_3$) which may be deposited by pulsed laser deposition (PLD). Crystalline dielectric layer 120 may be formed directly on substrate surface 110 of substrate 140 and may define an oxide surface 122 (e.g., a top surface). Oxide surface 122 may be located substantially opposite and/or parallel relative to substrate surface 110. Crystalline dielectric layer 120 may be formed as a buried oxide (BOX) layer (e.g., an oxide layer disposed between semiconductor layers) as shown/described in embodiments herein. In one embodiment, substrate surface 110 of substrate 140 may be subjected to an epitaxial growth process 450 to form crystalline dielectric layer 120 on substrate 140 (e.g., crystalline dielectric layer 120 may be epitaxially grown). In another embodiment, crystalline dielectric layer 120 may be deposited on substrate surface 110 in contact with N-well regions 156 and P-well region 154. In one embodiment, crystalline dielectric layer 120 may be grown (through epitaxial growth process 450) to a thickness R of about 5 nanometers to about 200 nanometers. Preferably, the crystalline dielectric layer 120 may be grown (through epitaxial growth process 450) to a thickness R of about 2 nanometers to about 20 nanometers. In one embodiment, REO in crystalline dielectric layer 120 may substantially cover substrate surface 110, maintaining the lattice information between underlying substrate 140 and layers and/or devices formed on and above crystalline dielectric layer 120 (e.g., oxide surface 122).

Figure 5:
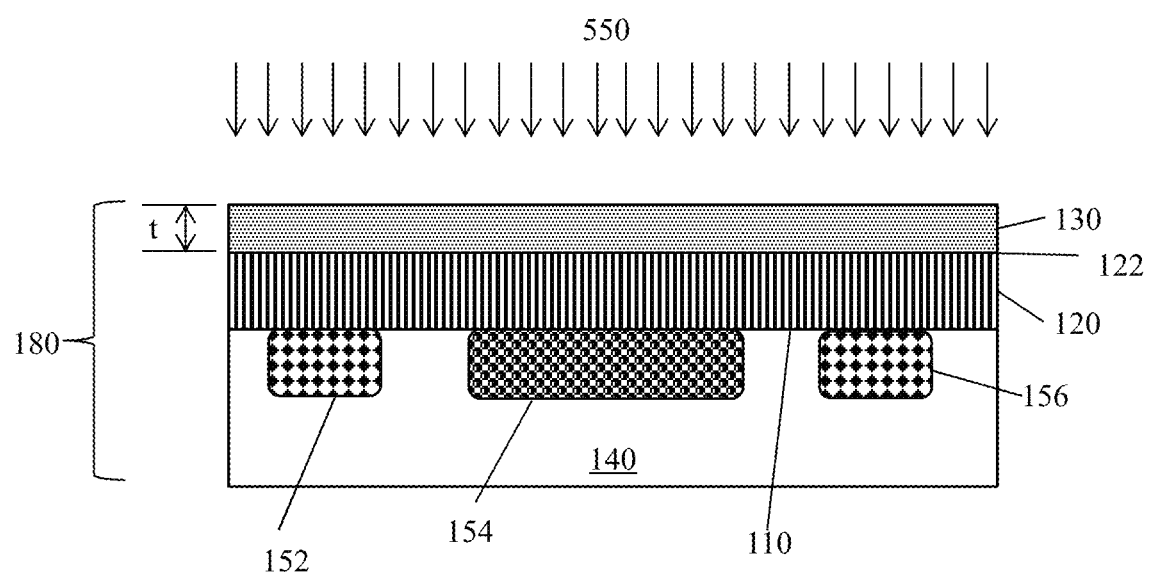

Next, in FIG. 5, an illustration of oxide surface 122 being subjected to a deposition 550 of a crystalline semiconductor layer 130 (e.g., a thin silicon layer, (thus forming an extremely thin silicon on insulator (ETSOI) structure), a single crystalline silicon layer, a device layer, etc.) to form structure 180 is shown in accordance with embodiments. In an embodiment, crystalline semiconductor layer 130 is grown epitaxially on oxide surface 122 of crystalline dielectric layer 120. Crystalline semiconductor layer 130 may have a thickness 't' of about 2 nanometers (nm) to about 20 nm. In one embodiment, crystalline semiconductor layer 130 may have a thickness 't' of about 10 nm. In one embodiment, crystalline semiconductor layer 130 may be strained. In an embodiment, crystalline semiconductor layer 130 (e.g., a device layer) may be strained or not strained depending on a condition of crystalline dielectric layer 120 (e.g., the lattice engineering of the REO in crystalline dielectric layer 120). It is understood that crystalline semiconductor layer 130 may include any suitable semiconductor material such as Si, Ge, SiGe, Si:C (carbon doped Si), SiGe:C, GeSn, III-V, II-V, or a combination thereof. Cystalline semiconductor layer 130 may be doped or undoped. Further, semiconductor device 100 may include different layers/regions/portions with a crystalline semiconductor layer 130 which varies/includes differing compositions, stresses, doping levels, and/or thicknesses.

Figure 6:
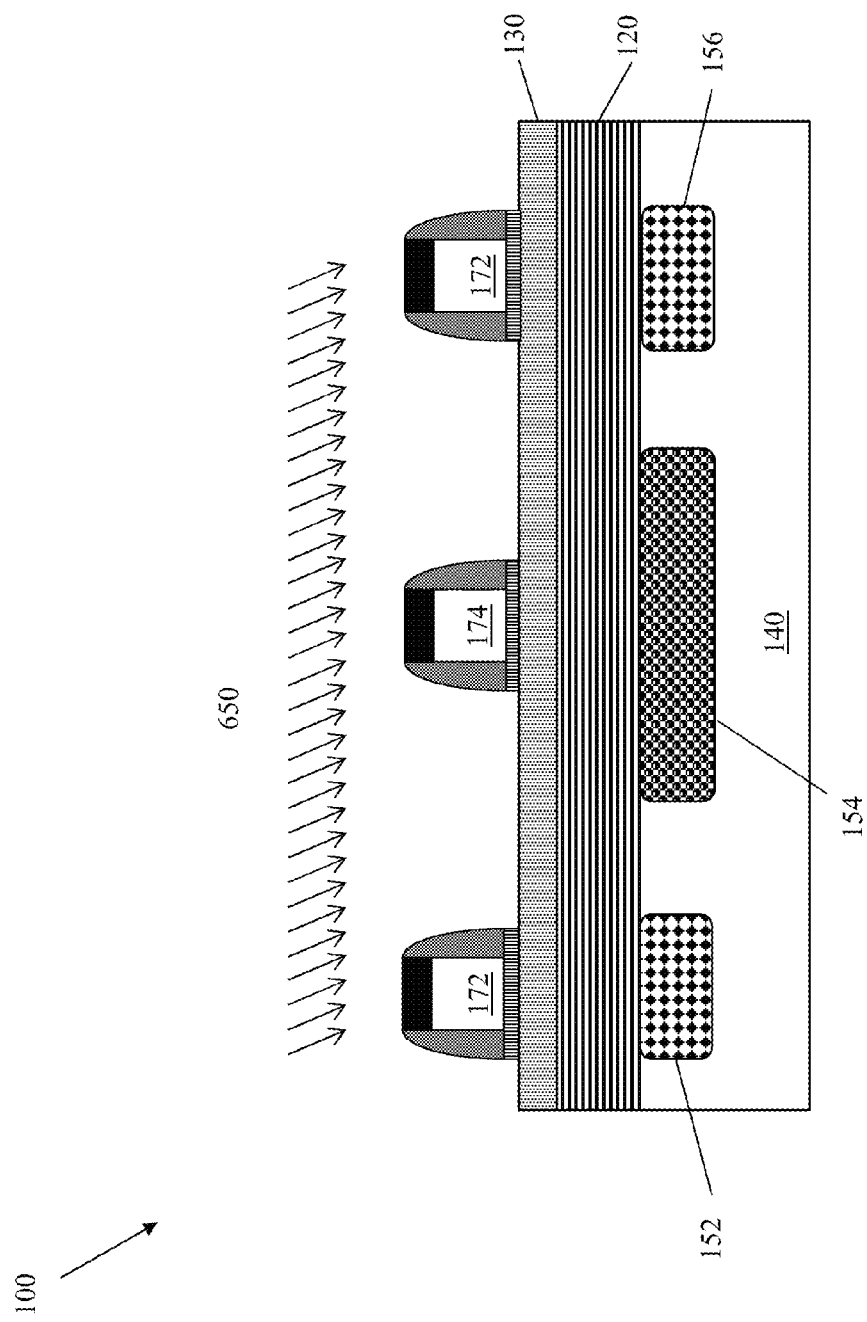

Next, in FIG. 6, an illustration is shown where semiconductor device 100 is subjected to a series of device formation processes 650 following cessation of formation of crystalline semiconductor layer 130 in accordance with embodiments. Once formation of crystalline semiconductor layer 130 has stopped, series of device formation processes 650 (e.g., FET formation) may develop devices (e.g., gates, transistors, etc.) on structure 180. In an embodiment, series of device formation processes 650 may form P-well transistor 174 and set of N-well transistors 172 on crystalline semiconductor layer 130. In one embodiment, P-well transistor 174 and set of N-well transistors 172 may be formed on crystalline semiconductor layer 130 such that P-well transistor 174 and set of N-well transistors 172 are aligned to the underlying implanted region(s) (e.g., N-well 156 and P-well 154) intended for back-gate control of the above device (e.g., substrate bias, body effect to threshold voltages, etc.). In one embodiment, P-well transistor 174 may be formed directly over and/or communicatively connected to P-well region 154, and set of N-well transistors 172 may be formed directly over and/or communicatively connected to set of N-well regions 152. This orientation causing P-well transistor 174 and N-well transistor 172 to include a device characteristic (e.g., a threshold voltage) which is a function of the well doping and/or the voltage applied to the well beneath each transistor. In an embodiment, each of the P-well and/or N-well transistors can be either n-type or p-type and may be connected to the P-well 154 and/or N-well 156 through a contact.

Figure 7:
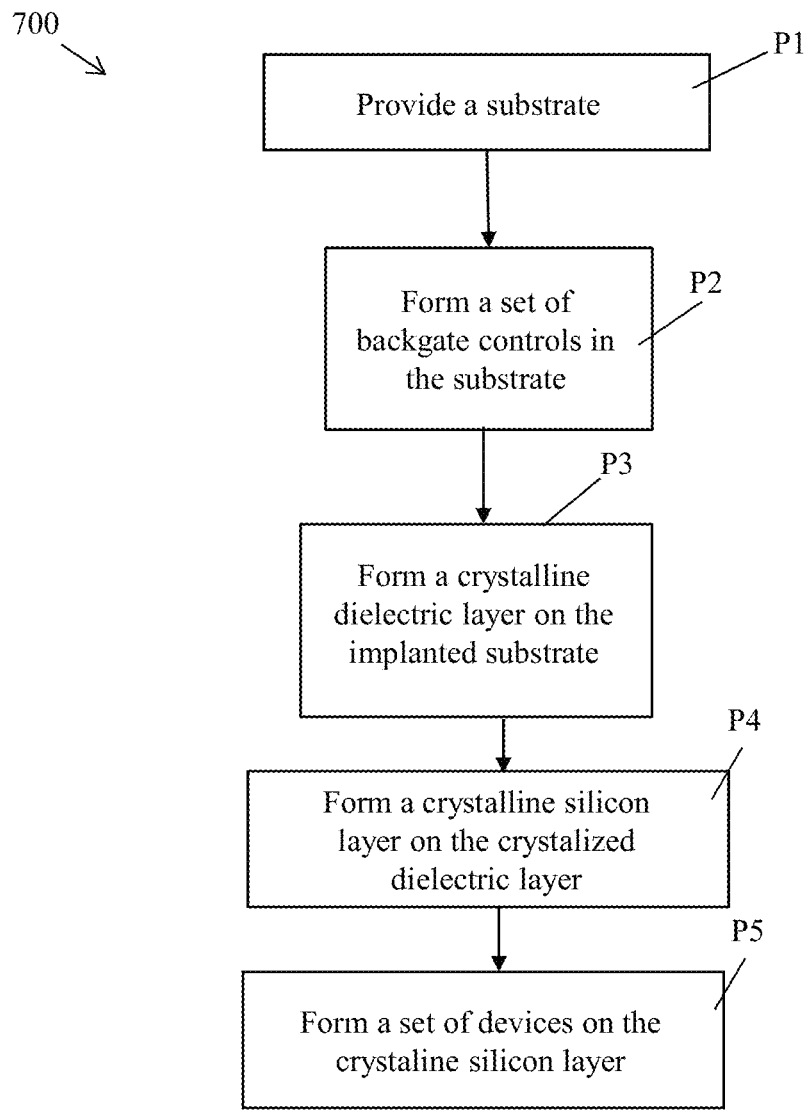
FIG. 7 is an illustration of a flow diagram illustrating steps in a method of fabricating a semiconductor device in accordance with an embodiment.

Turning to FIG. 7, a flow diagram 700 is shown illustrating a process according to aspects of the invention. In this embodiment, method flow diagram 700 includes a method for forming a semiconductor device 100 including a structure 180 and a set of devices thereon. In process P1, a substrate 140 is provided for formation of integrated circuit 100. Following process P1, in process P2 a set of back-gate controls/regions/wells 150 are formed in substrate 140. In one embodiment, set of back-gate controls/regions/wells 150 may be implanted in substrate 140. Set of regions 150 may include P-well regions and/or N-well regions. Implantation and/or doping of back-gate controls/regions/wells 150 may be performed in accordance with known processes. Following process P2, in Process P3, a crystalline dielectric layer 120 is formed on substrate surface 110 of substrate 140 above set of regions 150. Crystalline dielectric layer 120 may include rare earth oxides and may be grown/formed through epitaxial growth on a surface of substrate 140.

Following process P3, in process P4, a crystalline semiconductor layer 130 is formed on oxide surface 122 of crystalline dielectric layer 120 (thereby forming an extremely thin semiconductor on insulator (ETSOI) device). Crystalline semiconductor layer 130 may include an extremely thin semiconductor layer and may be deposited and/or epitaxially grown on oxide surface 122. Crystalline semiconductor layer 130 may include any suitable semiconductor material including Si, Ge, SiGe, Si:C (carbon doped Si), SiGe:C, GeSn, III-V, II-V, or a combination thereof. Following process P4, in process P5, a set of devices (e.g., transistors) 170 are formed on crystalline semiconductor layer 130. In an embodiment, set of devices 170 may be field effect transistors (FETs) located directly above and/or communicatively connected to set of regions 150.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
    forming a set of doped regions in a substrate;
    forming a crystalline dielectric layer directly on the substrate, the crystalline dielectric layer including an epitaxial oxide;
    forming a crystalline semiconductor layer on the crystalline dielectric layer, the semiconductor layer and the crystalline dielectric layer forming an extremely thin semiconductor-on-insulator (ETSOI) structure, wherein the crystalline semiconductor layer is unstrained; and
    forming a set of devices on the semiconductor layer, wherein at least one device in the set of devices is formed over a doped region.

2. The method of claim 1, wherein the set of devices include at least one field effect transistor (FET).

3. The method of claim 1, wherein the forming the set of doped regions includes incorporating dopants in a region of the substrate.

4. The method of claim 1, wherein the set of doped regions include at least one P-well or at least one N-well.

5. The method of claim 1, wherein the semiconductor layer includes at least one of: silicon, silicon germanium, carbon doped silicon, group III-V compound semiconductor materials, or group II-VI compound semiconductor materials.

6. The method of claim 1, wherein the forming the crystalline dielectric layer includes epitaxially growing the crystalline dielectric layer directly on the substrate.

7. The method of claim 1, wherein the crystalline dielectric layer includes a rare earth oxide (REO).

8. The method of claim 1, wherein the crystalline dielectric layer has a thickness of about 2 nanometers to about 20 nanometers.

9. A method of forming a back-gate substrate structure, the method comprising:
    forming a doped region in a substrate, the doped region configured to communicatively connect to a field effect transistor (FET);
    forming a crystalline dielectric layer directly on the substrate and the doped region, the crystalline dielectric layer including an epitaxial oxide;
    forming a crystalline semiconductor layer on the crystalline dielectric layer, wherein the crystalline semiconductor layer is unstrained; and
    forming a set of devices on the crystalline semiconductor layer above the doped region.

10. The method of claim 9, wherein the forming the doped region includes implanting a portion of the substrate.

11. The method of claim 9, wherein the crystalline dielectric layer includes a rare earth oxide (REO).

12. The method of claim 9, wherein the crystalline semiconductor layer includes an extremely thin silicon layer forming an ETSOI structure, the extremely thin silicon layer including at least one of: silicon, silicon germanium, carbon doped silicon, group III-V compound semiconductor materials, or group II-VI compound semiconductor materials.

13. The method of claim 9, wherein the crystalline dielectric layer has a thickness of about 2 nanometers to about 20 nanometers.

14. A method of forming a semiconductor device, the method comprising:
    forming a doped region in a substrate;
    forming a crystalline dielectric layer directly on the substrate and the doped region, the crystalline dielectric layer including an epitaxial oxide;
    forming a crystalline semiconductor layer on the crystalline dielectric layer, wherein the crystalline semiconductor layer is unstrained; and
    forming a field effect transistor (FET) on the crystalline semiconductor layer above the doped region.

15. The method of claim 14, wherein the forming the doped region includes implanting a portion of the substrate to form a P-well and an N-well.

16. The method of claim 14, wherein the crystalline semiconductor layer includes an extremely thin silicon layer forming an ETSOI structure, the extremely thin silicon layer including at least one of: silicon, silicon germanium, carbon doped silicon, group III-V compound semiconductor materials or group II-VI compound semiconductor materials.

17. The method of claim 14, wherein the crystalline dielectric layer includes a rare earth oxide (REO) and has a thickness of about 2 nanometers to about 20 nanometers.

* * * * *